(12) United States Patent
Okazaki

(10) Patent No.: US 12,382,697 B2
(45) Date of Patent: Aug. 5, 2025

(54) SEMICONDUCTOR DEVICE AND METHOD FOR MANUFACTURING THE SAME

(71) Applicant: Mitsubishi Electric Corporation, Tokyo (JP)

(72) Inventor: Hiroyuki Okazaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 428 days.

(21) Appl. No.: 18/002,642

(22) PCT Filed: Dec. 22, 2020

(86) PCT No.: PCT/JP2020/047948
§ 371 (c)(1),
(2) Date: Dec. 20, 2022

(87) PCT Pub. No.: WO2022/137347
PCT Pub. Date: Jun. 30, 2022

(65) Prior Publication Data
US 2023/0238438 A1  Jul. 27, 2023

(51) Int. Cl.
*H10D 64/23* (2025.01)
*H10D 62/83* (2025.01)
(Continued)

(52) U.S. Cl.
CPC ........... *H10D 64/256* (2025.01); *H10D 62/83* (2025.01); *H10D 64/01* (2025.01); *H10D 64/62* (2025.01); *H10D 64/64* (2025.01)

(58) Field of Classification Search
CPC ............. H10D 30/4755; H10D 30/472; H10D 62/824; H10D 62/8503; H10D 62/852;
(Continued)

(56) References Cited

U.S. PATENT DOCUMENTS

2009/0001478 A1*  1/2009  Okamoto ............. H10D 64/254
                                              257/E21.627
2013/0288401 A1* 10/2013  Matsuura ............. H10D 30/015
                                              438/14
2014/0231997 A1   8/2014  Sasaki et al.

FOREIGN PATENT DOCUMENTS

JP    2013-187224 A    9/2013
JP    2014-187342 A   10/2014
WO    2019/150526 A1   8/2019

OTHER PUBLICATIONS

International Search Report issued in PCT/JP2020/047948; mailed Mar. 23, 2021.

* cited by examiner

*Primary Examiner* — Wasiul Haider
(74) *Attorney, Agent, or Firm* — Studebaker Brackett PLLC

(57) ABSTRACT

A semiconductor substrate (1) includes a front surface and a back surface opposite to each other, and a through-hole (9) penetrating from the back surface to the front surface. A metal film (10) surrounding the through-hole (9) is formed in a ring shape on the front surface. A front-surface electrode (6) includes a wiring electrode (11,12) covering the through-hole (9) and the metal film (10) and is joined to the front surface outside the metal film (10). A back-surface electrode (15) is formed on the back surface and inside the through-hole (9) and connected to the wiring electrode (11,12). The metal film (10) has a lower ionization tendency and a higher work function than the wiring electrode (11,12).

10 Claims, 15 Drawing Sheets

(51) Int. Cl.
*H10D 64/01* (2025.01)
*H10D 64/62* (2025.01)
*H10D 64/64* (2025.01)

(58) Field of Classification Search
CPC ......... H10D 64/513; H10D 30/47–485; H10D 30/015; H10D 64/62; H10D 64/64; H10D 64/23

See application file for complete search history.

SEMICONDUCTOR DEVICE AND METHOD FOR MANUFACTURING THE SAME

FIELD

The present disclosure relates to a semiconductor device including a through-hole for connecting a back-surface electrode and a front-surface electrode and a method for manufacturing the same

BACKGROUND

A high electron mobility transistor (HEMT) or the like intended for high-frequency wave operation is formed of a compound semiconductor such as a nitride semiconductor. Typically, in such a semiconductor device, a through-hole called a via hole is formed at a semiconductor substrate to connect a ground terminal that is a back-surface electrode to a front surface electrode.

However, the thickness of a semiconductor substrate such as GaN on SiC is typically 50 µm to 100 µm approximately. When a through-hole is formed at the substrate by dry etching, a large amount of residues are deposited on the inner sidewall and bottom surface of the through-hole. Fluorine-based dry etching used in GaN selective etching or the like is effective for through-hole formation but cannot prevent generation of sidewall residues and bottom-surface residues. Thus, the residues need to be removed by using strongly acid solution such as concentrated hydrochloric acid.

Furthermore, an underlayer of the front surface electrode is a receiver metal of dry etching at through-hole formation. A Ti-based ohmic electrode, which is typically used, is vulnerable to strongly acid solution and dissolved at a high etching rate. As a result, reliability decreases. Long-period reliability cannot be assured due to penetration or side etching of the front surface electrode unless the underlayer of the front surface electrode is formed of a stable metal that is high etching selectiveness. Thus, Pt (platinum), which has a positive standard oxidation-reduction potential in ionization tendency, is employed as a receiver metal of etching at the underlayer of the front surface electrode (refer to PTL 1, for example).

CITATION LIST

Patent Literature

[PTL 1] JP 2014-187342 A

SUMMARY

Technical Problem

However, Pt has a large film stress and a low adhesiveness to GaN. Thus, when Pt is used as the underlayer of the front surface electrode, the risk of peeling or the like of the front surface electrode is high, which affects other reliability.

The present disclosure is made to solve the above-described problem and intended to obtain a highly reliable semiconductor device and a method for manufacturing the same.

Solution to Problem

A semiconductor device according to the present disclosure includes: a semiconductor substrate including a front surface and a back surface opposite to each other, and a through-hole penetrating from the back surface to the front surface; a metal film surrounding the through-hole and formed in a ring shape on the front surface; a front-surface electrode including a wiring electrode covering the through-hole and the metal film and joined to the front surface outside the metal film; and a back-surface electrode formed on the back surface and inside the through-hole and connected to the wiring electrode, wherein the metal film has a lower ionization tendency and a higher work function than the wiring electrode.

Advantageous Effects of Invention

In the present disclosure, the metal film surrounding the through-hole is formed on the front surface of the semiconductor substrate. The metal film has a lower ionization tendency than the front-surface electrode and thus has a high wet resistance against strongly acid solution. Accordingly, side etching of the front-surface electrode can be prevented in wet etching for removing sidewall residues after formation of the through-hole. Moreover, the front-surface electrode is joined to the front surface of the semiconductor substrate outside the metal film having a low adhesiveness. As a result, anomaly such as metal floating of the front-surface electrode can be prevented and reliability can be improved.

DESCRIPTION OF EMBODIMENTS

A semiconductor device and a method for manufacturing the same according to the embodiments of the present disclosure will be described with reference to the drawings. The same components will be denoted by the same symbols, and the repeated description thereof may be omitted.

Embodiment 1

Figure 1:
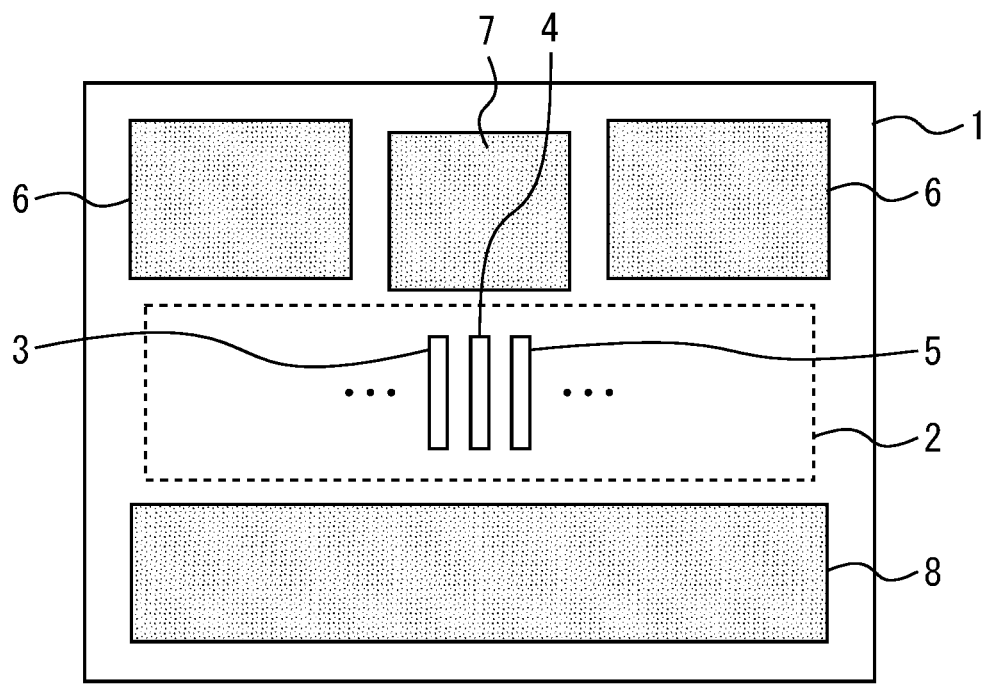
FIG. 1 is a plan view illustrating a semiconductor device according to Embodiment 1.

FIG. 1 is a plan view illustrating a semiconductor device according to Embodiment 1. An active region 2 for a transistor is formed on a semiconductor substrate 1. A transistor including a plurality of source electrodes 3, a plurality of gate electrodes 4, and a plurality of drain electrodes 5 is formed in the active region 2. A source pad 6, a gate pad 7, and a drain pad 8 are provided on the semiconductor substrate 1. The source pad 6 is connected to the plurality of source electrodes 3. The gate pad 7 is connected to the gate electrodes 4. The drain pad 8 is connected to the plurality of drain electrodes 5.

Figure 2:
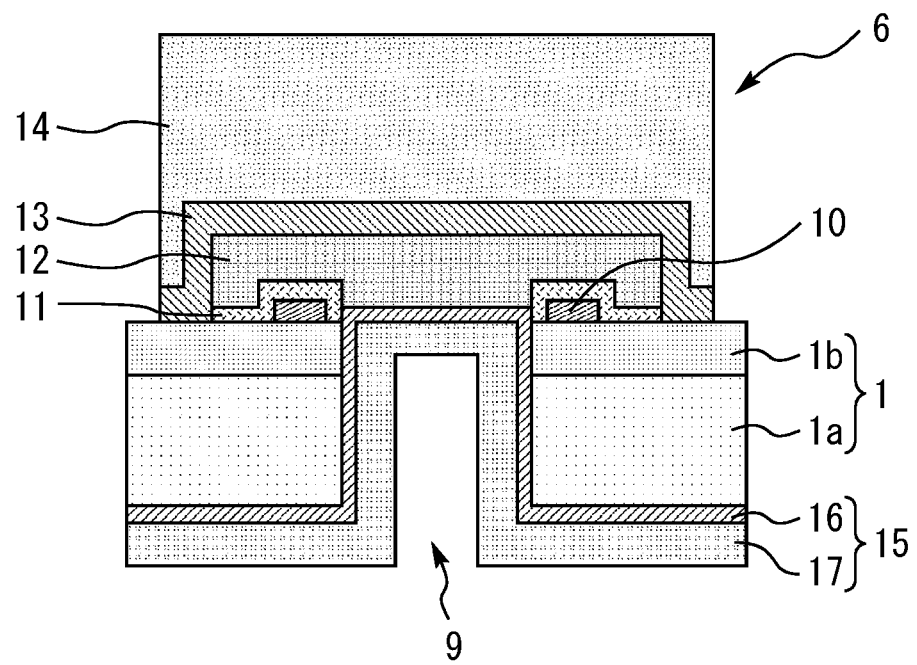
FIG. 2 is a cross-sectional view of a source pad part of FIG. 1.
Figure 3:
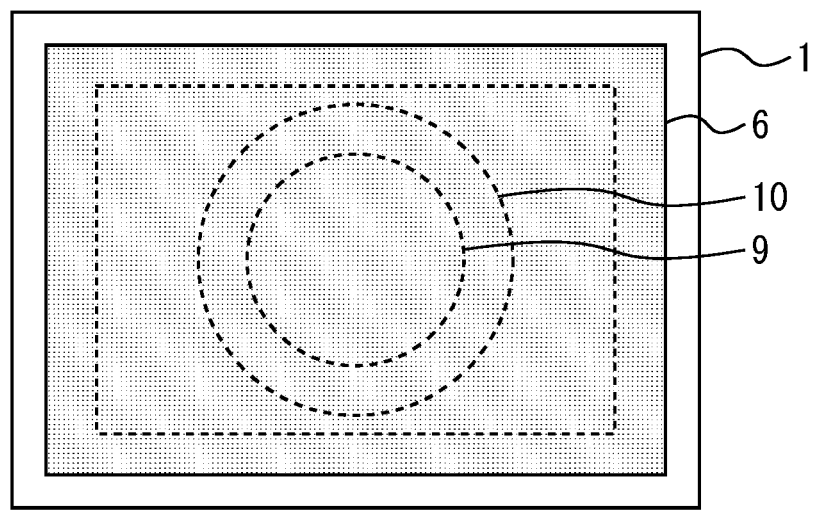
FIG. 3 is an enlarged plan view of the source pad part of FIG. 1.

FIG. 2 is a cross-sectional view of a source pad part of FIG. 1. Illustrations of electrode insulating films, the gate electrodes, the drain electrodes, and the like are omitted in FIG. 2. FIG. 3 is an enlarged plan view of the source pad part of FIG. 1. The semiconductor substrate 1 includes a SiC substrate 1a and a GaN layer 1b formed thereon. A through-hole 9 penetrates from the back surface of the semiconductor substrate 1 to the front surface thereof.

A metal film 10 surrounding the through-hole 9 is formed in a ring shape on the front surface of the semiconductor substrate 1. The metal film 10 is a single-layer metal made of any metal of Pt, Ni, and Ta or is a multiple-layer metal including the metal as its lowermost layer.

The source pad 6 is formed on the front surface of the semiconductor substrate 1. The source pad 6 includes wiring electrodes 11 and 12, a front-surface power supply layer 13, and a front-surface plating 14, which are sequentially stacked. The wiring electrodes 11 and 12 cover the through-hole 9 and the metal film 10. The wiring electrode 11 is joined to the front surface of the semiconductor substrate 1 outside the metal film 10. The wiring electrode 11 contacts the GaN layer 1b and thus is preferably a metal such as Ti. The wiring electrodes 11 and 12 are formed in a range smaller than the front-surface power supply layer 13 and the front-surface plating 14 and larger than the metal film 10.

A back-surface electrode 15 is formed on the back surface of the semiconductor substrate 1 and inside the through-hole 9 and connected in direct contact to the wiring electrodes 11 and 12. The back-surface electrode 15 includes a back-surface power supply layer 16 and a back-surface plating 17, which are sequentially stacked. The front-surface plating 14 and the back-surface plating 17 are, for example, Au plating.

The metal film 10 has a lower ionization tendency and a higher work function than the wiring electrodes 11 and 12. Thus, Pt is most preferable as the material of the metal film 10 but may be substituted by another metal such as Ni or Ta.

Subsequently, a method for manufacturing the semiconductor device according to the present embodiment will be described. FIGS. 4, 5, 7, 9, 11, and 13 are cross-sectional views illustrating the method for manufacturing the semiconductor device according to Embodiment 1. FIGS. 6, 8, 10, and 12 are plan views illustrating the method for manufacturing the semiconductor device according to Embodiment 1. Detailed description of an electrode formation method, thinning, and the like is omitted.

Figure 4:
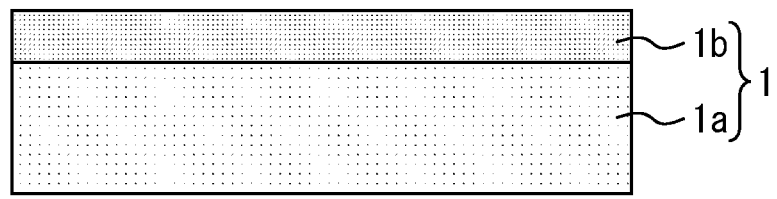
FIG. 4 is a cross-sectional view illustrating the method for manufacturing the semiconductor device according to Embodiment 1.

First, as illustrated in FIG. 4, the semiconductor substrate 1 is formed by epitaxially growing the GaN layer 1b on the SiC substrate 1a.

Figure 5:
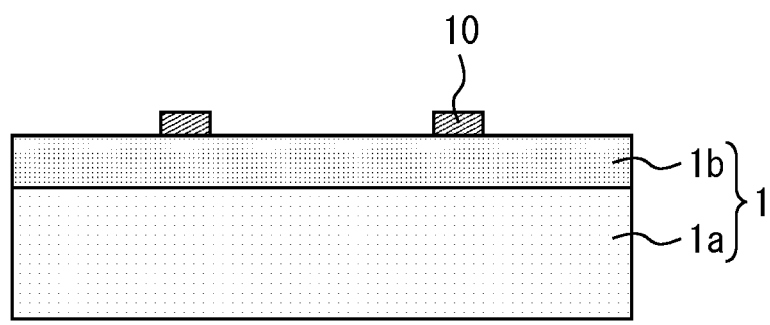
FIG. 5 is a cross-sectional view illustrating the method for manufacturing the semiconductor device according to Embodiment 1.
Figure 6:
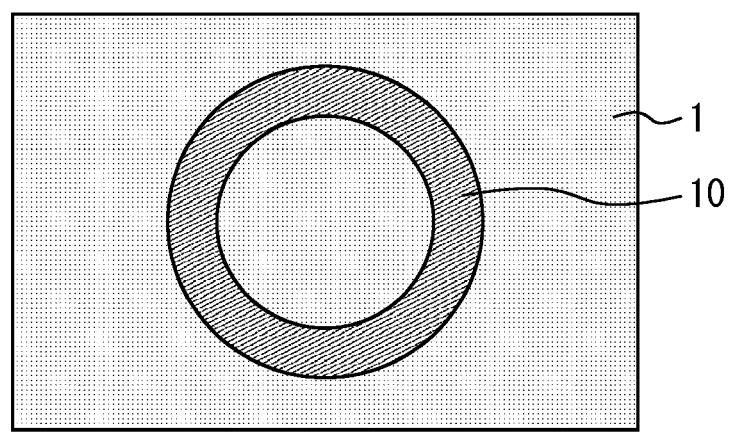
FIG. 6 is a plan view illustrating the method for manufacturing the semiconductor device according to Embodiment 1.

Subsequently, as illustrated in FIGS. 5 and 6, the metal film 10 is formed in a ring shape on the front surface of the semiconductor substrate 1. To pattern the metal film 10 in a ring shape by liftoff, highly anisotropic sputtering, for example, long throw sputtering is preferable as a method for depositing the metal film 10. Alternatively, the metal film 10 may be formed in a ring shape by performing liftoff using a two-layer resist. The thickness of the metal film 10 is preferably several nm to several tens nm approximately from a viewpoint of adhesiveness.

Figure 7:
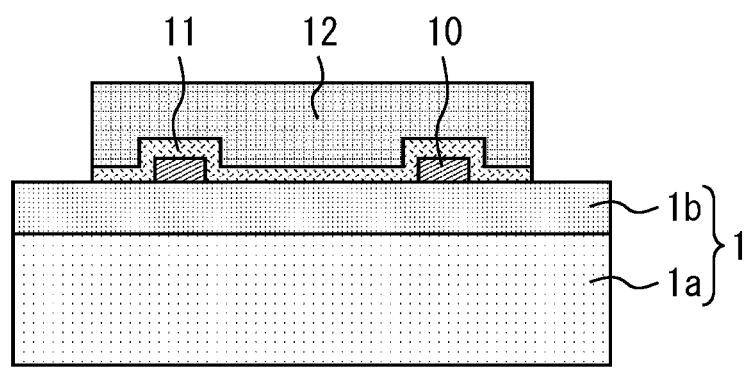
FIG. 7 is a cross-sectional view illustrating the method for manufacturing the semiconductor device according to Embodiment 1.
Figure 8:
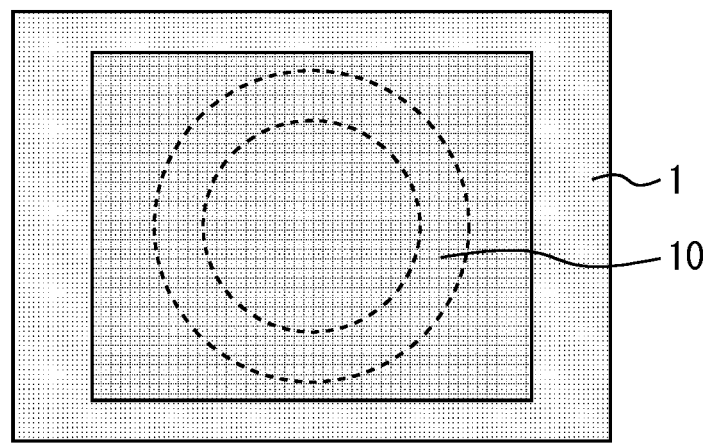
FIG. 8 is a plan view illustrating the method for manufacturing the semiconductor device according to Embodiment 1.

Subsequently, as illustrated in FIGS. 7 and 8, the wiring electrodes 11 and 12 are formed on the front surface of the semiconductor substrate 1 to cover the metal film 10 having a low adhesiveness to the GaN layer 1b. The wiring electrode 11 is joined to the front surface of the semiconductor substrate 1 outside the metal film 10.

The wiring electrode 12 is used as a receiver metal at dry etching for forming the through-hole 9 and is typically preferably a metal that forms a stable metal as an alloy with Ti. Thus, the material of the wiring electrode 12 is preferably, for example, Au but may be a single-layer metal or a multiple-layer metal. However, when the wiring electrode 12 contains Pt or the like, which is the material of the metal film 10, residues that are difficult to remove are generated at formation of the through-hole 9. Thus, the wiring electrode 12 preferably does not contain the material of the metal film 10.

Figure 9:
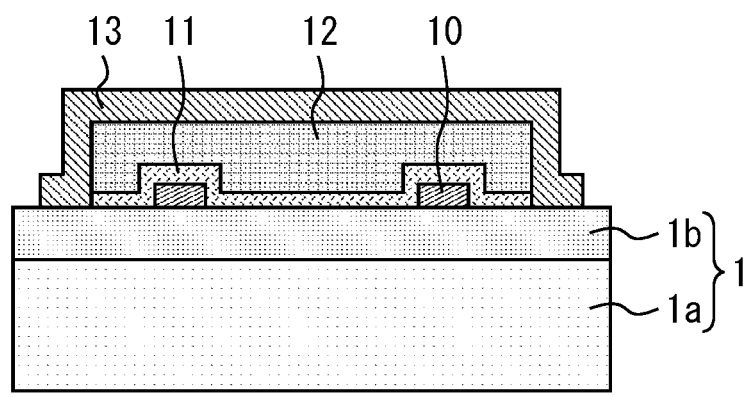
FIG. 9 is a cross-sectional view illustrating the method for manufacturing the semiconductor device according to Embodiment 1.
Figure 10:
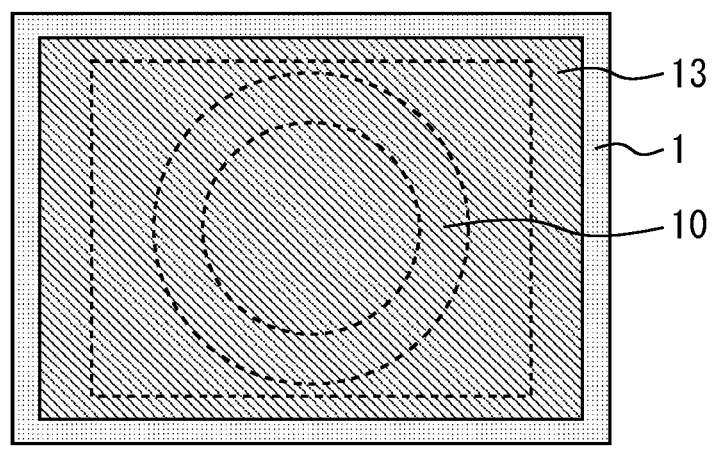
FIG. 10 is a plan view illustrating the method for manufacturing the semiconductor device according to Embodiment 1.

Subsequently, as illustrated in FIGS. 9 and 10, the front-surface power supply layer 13 is formed to entirely cover the wiring electrode 12. The material of the front-surface power supply layer 13 is preferably an alloy containing Pt and is, for example, Ti/Pt/Au. When the outermost surface is coated with an alloy containing Pt in this manner, Br corrosion can be prevented and reliability improves.

Figure 11:
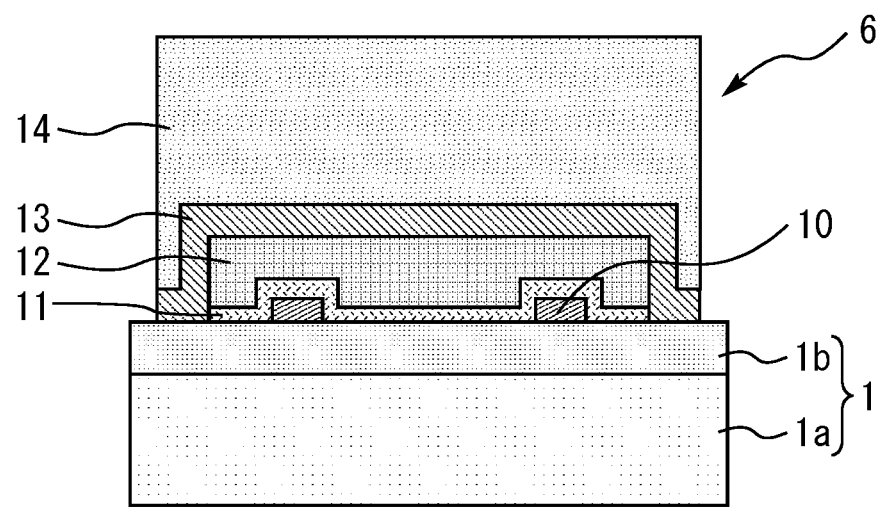
FIG. 11 is a cross-sectional view illustrating the method for manufacturing the semiconductor device according to Embodiment 1.
Figure 12:
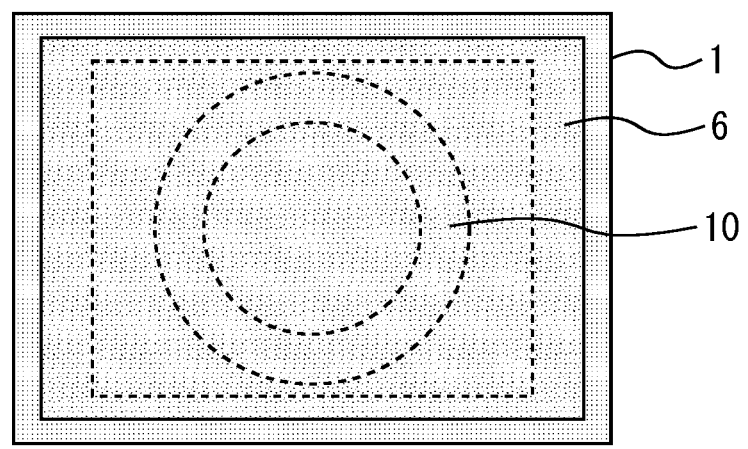
FIG. 12 is a plan view illustrating the method for manufacturing the semiconductor device according to Embodiment 1.

Subsequently, as illustrated in FIGS. 11 and 12, Au plating is performed to form the front-surface plating 14 on the front-surface power supply layer 13. The present process completes a wafer process on the front-surface side.

Figure 13:
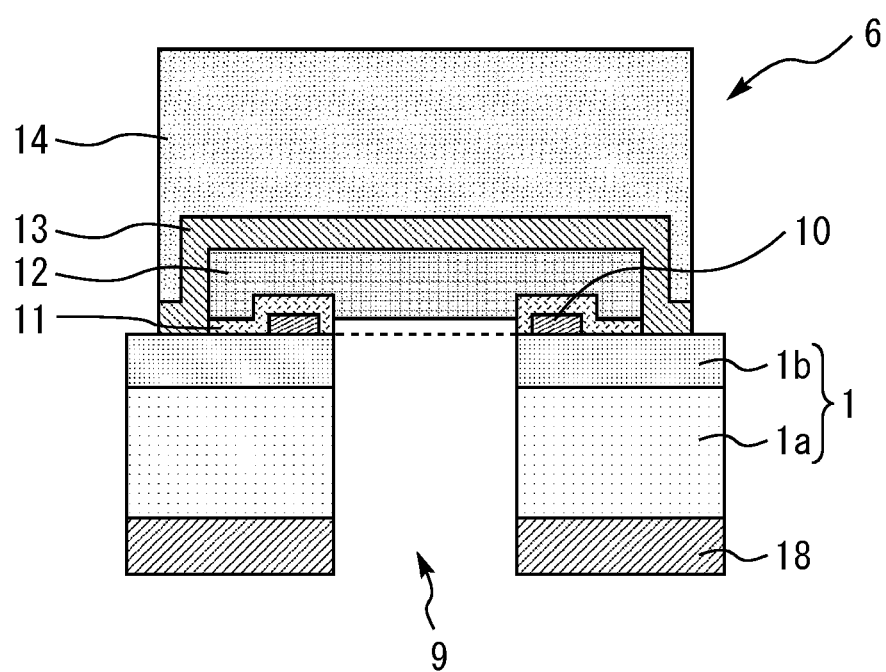
FIG. 13 is a cross-sectional view illustrating the method for manufacturing the semiconductor device according to Embodiment 1.

Subsequently, as illustrated in FIG. 13, a metal mask 18 made of Ni or the like and having an opening is formed at a through-hole formation place. The SiC substrate 1a and the GaN layer 1b are sequentially etched from the back surface of the semiconductor substrate 1 by, for example, selective dry etching using fluorine-based gas, and accordingly, the through-hole 9 is formed. The through-hole 9 reaches the wiring electrodes 11 and 12 inside the metal film 10 in a ring shape. In this case, the wiring electrode 11 at the bottom surface of the through-hole 9 is removed by the dry etching, and the etching stops at the wiring electrode 12 functioning as a receiver metal.

In the dry etching, residues are generated on the sidewall of the through-hole 9. Thus, the residues are removed by performing wet etching using strongly acid solution, for example, concentrated hydrochloric acid. However, the wiring electrode 11 made of Ti has a low wet resistance against the strongly acid solution. Without the metal film 10, side etching proceeds from the sidewall at the bottom surface of the through-hole 9, and as a result, anomaly such as metal floating of the source pad 6 occurs and reliability such as humidity resistance degrades. The side etching can be prevented by providing the metal film 10.

Subsequently, the metal mask 18 is removed by, for example, ion milling or wet etching. Lastly, as illustrated in FIGS. 2 and 3, the back-surface power supply layer 16 made of, for example, Ti/Au is formed on the back surface of the semiconductor substrate 1 and in the through-hole 9 and connected to the wiring electrodes 11 and 12. Au plating is performed to form the back-surface plating 17 on the back-surface power supply layer 16. The back-surface plating 17 is not limited to Au but may be Cu, for example.

As described above, in the present embodiment, the metal film 10 surrounding the through-hole 9 is formed on the front surface of the semiconductor substrate 1. The metal film 10 has a lower ionization tendency than the source pad 6 and thus has a high wet resistance against strongly acid solution. Accordingly, side etching of the source pad 6 can be prevented in wet etching for removing sidewall residues after formation of the through-hole 9. Moreover, the source pad 6 is joined to the front surface of the semiconductor substrate 1 outside the metal film 10 having a low adhesiveness. As a result, anomaly such as metal floating of the source pad 6 can be prevented and reliability can be improved.

When the metal film 10 is formed not in a ring shape but in the entire formation region of the through-hole 9, the metal film 10 is a receiver metal of dry etching. For example, in a case of dry etching using fluorine-based gas, residues containing Pt, which cannot be removed by concentrated hydrochloric acid processing, are generated on the bottom surface of the through-hole 9 and causes problems with reliability and appearance. These problems can be prevented by forming the metal film 10 in a ring shape. Moreover, adhesiveness degradation can be prevented when the metal film 10 that is a high stress metal such as Pt is deposited in a small range as possible.

The metal film 10 has a higher work function than the source pad 6. Thus, the metal film 10 can be formed simultaneously with the gate electrodes 4 of the transistor because the material of the metal film 10 can be also used for the gate electrodes 4 that are Schottky joined to the front surface of the semiconductor substrate 1. Accordingly, no additional process is needed for formation of the metal film 10, and thus it is possible to prevent increase of the number of processes and product cost. In this case, the gate electrodes 4 include a film of the same material as that of the metal film 10.

Part of the wiring electrodes 11 and 12 contacting the back-surface electrode 15 formed at the through-hole 9 is dry-etched at formation of the through-hole 9. To prevent generation of residues containing Pt, the wiring electrodes 11 and 12 preferably do not contain Pt.

Embodiment 2

Figure 14:
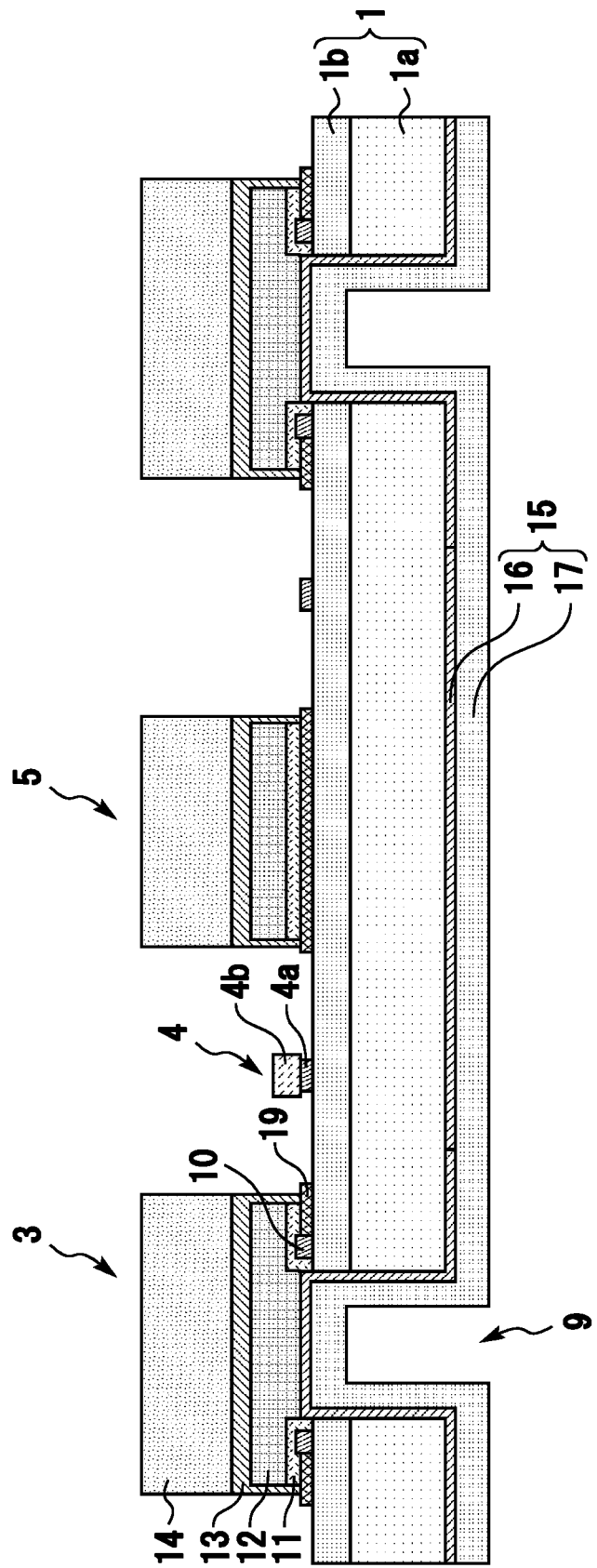
FIG. 14 is a cross-sectional view illustrating a semiconductor device according to Embodiment 2.

FIG. 14 is a cross-sectional view illustrating a semiconductor device according to Embodiment 2. The diagram is an enlarged view of the transistor in an active layer region. The source electrodes 3, the gate electrodes 4, and the drain electrodes 5 are formed on the front surface of the semiconductor substrate 1. The through-hole 9 is not formed at the source pad 6 as in Embodiment 1 but the through-hole 9 is formed at each source electrode 3 in the active region 2. In other words, the source electrode 3 is an individual-source-via (ISV) source electrode. The back-surface electrode 15 is connected to the source electrode 3 through the through-hole 9. The source electrode 3 includes, in addition to the configuration of the source pad 6 in Embodiment 1, an ohmic electrode 19 ohmic-joined to the front surface of the semiconductor substrate 1 outside the metal film 10. Each gate electrode 4 includes a gate underlaying metal 4a Schottky joined to the front surface of the semiconductor substrate 1, and a gate overlaying metal 4b formed thereon.

Subsequently, a method for manufacturing the semiconductor device according to the present embodiment will be described. FIGS. 15, 17, 19, 21, 23, 25, 27, and 28 are cross-sectional views illustrating the method for manufacturing the semiconductor device according to Embodiment 2. FIGS. 16, 18, 20, 22, 24, and 26 are plan views illustrating the method for manufacturing the semiconductor device according to Embodiment 2. Detailed description of an electrode formation method, thinning, and the like is omitted. Note that each plan view illustrates both a source electrode 3 and a gate electrode 4, but each cross-sectional view illustrates the source electrode 3 only.

Figure 15:
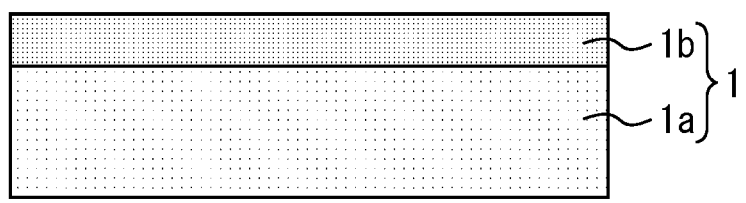
FIG. 15 is a cross-sectional view illustrating the method for manufacturing the semiconductor device according to Embodiment 2.
Figure 16:
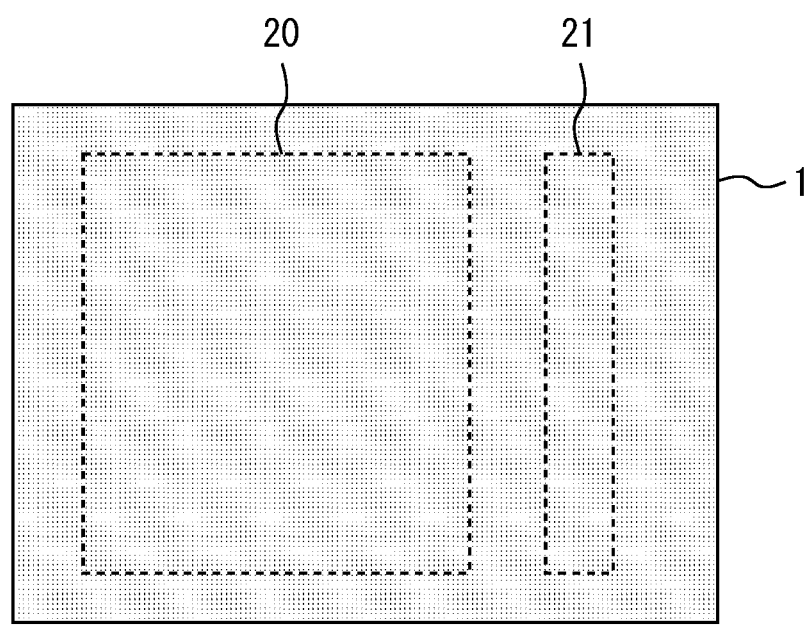
FIG. 16 is a plan view illustrating the method for manufacturing the semiconductor device according to Embodiment 2.

First, as illustrated in FIGS. 15 and 16, the semiconductor substrate 1 is formed by epitaxially growing the GaN layer 1b on the SiC substrate 1a. FIG. 16 illustrates a source-electrode formation region 20 in which the ISV source electrode 3 is to be formed in a later process, and a gate-electrode formation region 21 in which the gate electrode 4 is to be formed.

Figure 17:
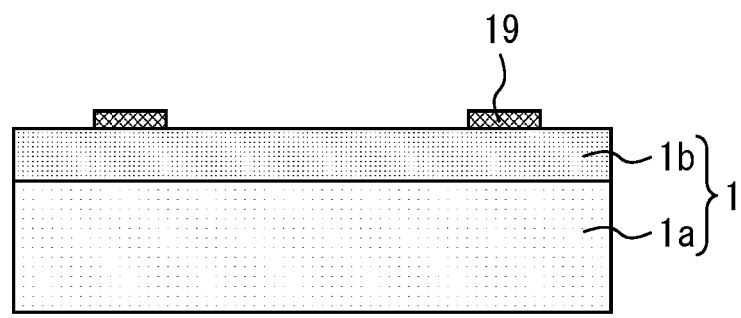
FIG. 17 is a cross-sectional view illustrating the method for manufacturing the semiconductor device according to Embodiment 2.
Figure 18:
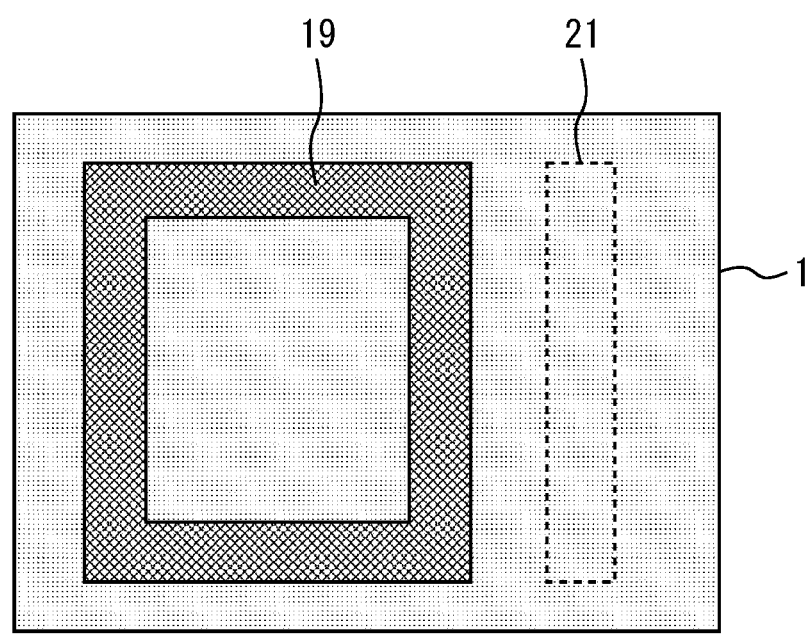
FIG. 18 is a plan view illustrating the method for manufacturing the semiconductor device according to Embodiment 2.

Subsequently, as illustrated in FIGS. 17 and 18, the ohmic electrode 19 ohmic-joined to the front surface of the semiconductor substrate 1 is formed at an outer peripheral part of the source-electrode formation region 20. The ohmic electrode 19 is a metal such as Cu, Ti, Al, Au, Ni, Nb, Pd, Pt, Cr, W, Ta, or Mo or a combination of a plurality of metals among them. The ohmic electrode 19 is ohmic joined to the semiconductor substrate 1.

Note that ohmic junction at a metal-semiconductor interface can be formed by forming multiple elements containing an element other than the metal elements on a semiconductor substrate through evaporation coating or the like and performing thermal treatment such as annealing. A modified layer in which a plurality of elements exist is formed at the metal-semiconductor interface after the thermal treatment. For example, a method of adding impurities and performing epitaxial growth, a method of diffusing impurities by ion implantation and thermal diffusion, or a method of combining a plurality of methods among the above-described methods may be used as another method.

Figure 19:
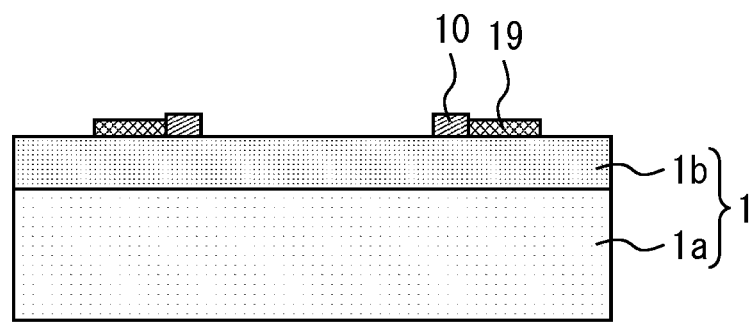
FIG. 19 is a cross-sectional view illustrating the method for manufacturing the semiconductor device according to Embodiment 2.
Figure 20:
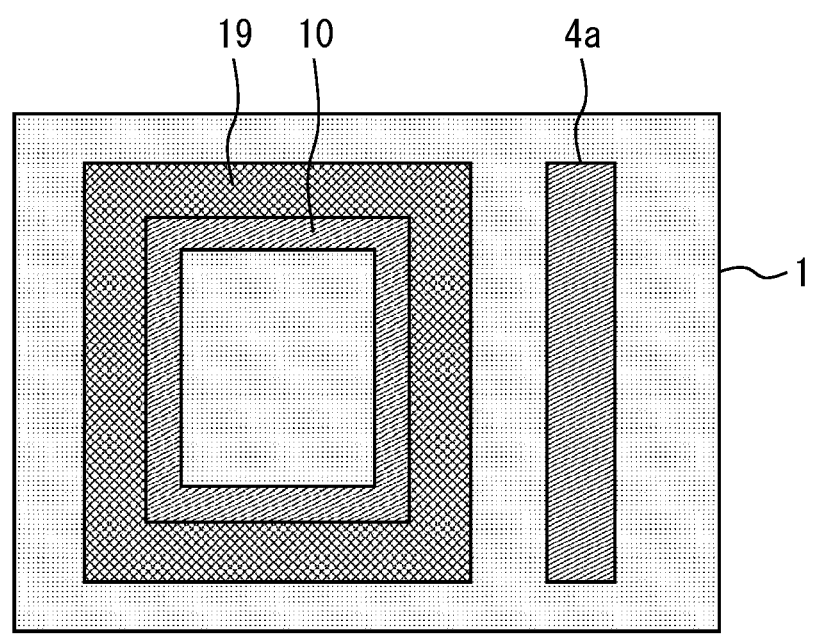
FIG. 20 is a plan view illustrating the method for manufacturing the semiconductor device according to Embodiment 2.

Subsequently, as illustrated in FIGS. 19 and 20, the metal film 10 is formed in a ring shape on the front surface of the semiconductor substrate 1 inside the ohmic electrode 19. The material of the metal film 10 is the same as in Embodiment 1 and is a Pt metal in this example.

The metal film 10 is also formed in the gate-electrode formation region 21 and used as the gate underlaying metal 4a of the gate electrode 4. In this manner, since the gate underlaying metal 4a of the gate electrode 4 is formed simultaneously with the metal film 10, it is possible to avoid increase of the number of processes. The metal film 10 is flush with or overlaps the ohmic electrode 19. Note that, although not illustrated, each drain electrode 5 does not need to have the same form as the ISV source electrode 3 according to the present embodiment.

Figure 21:
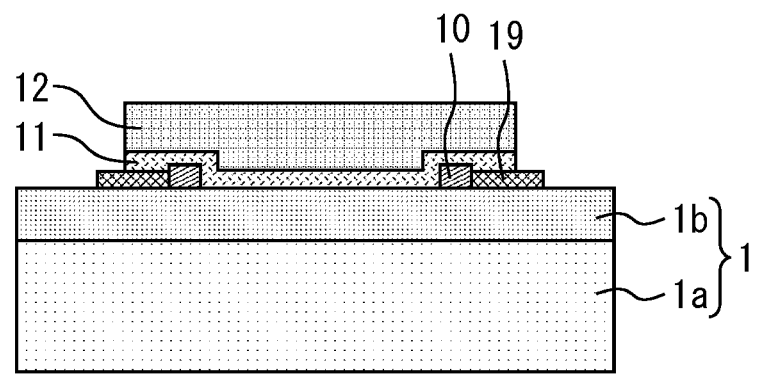
FIG. 21 is a cross-sectional view illustrating the method for manufacturing the semiconductor device according to Embodiment 2.
Figure 22:
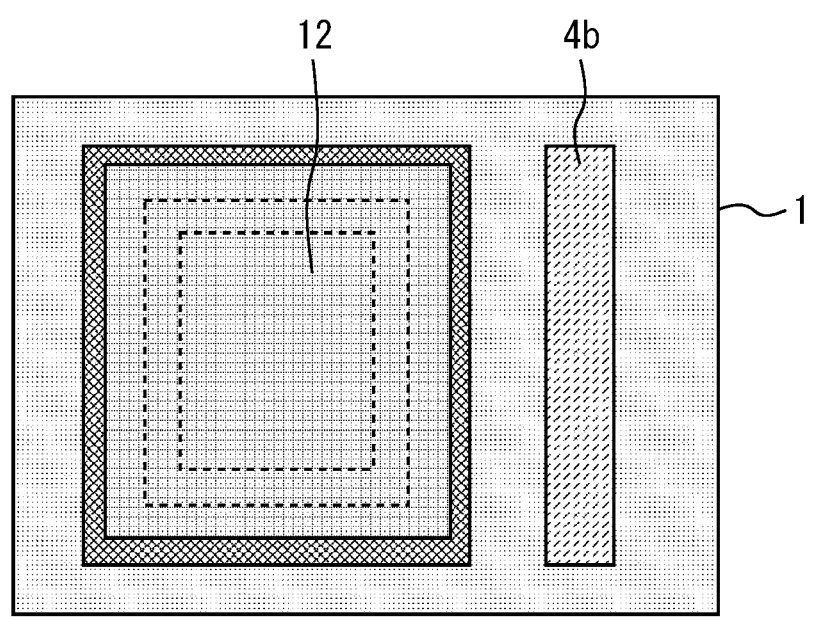
FIG. 22 is a plan view illustrating the method for manufacturing the semiconductor device according to Embodiment 2.

Subsequently, as illustrated in FIGS. 21 and 22, the wiring electrodes 11 and 12 are formed to cover the metal film 10 having a low adhesiveness to the GaN layer 1b. The wiring electrode 11 is preferably a metal such as Ti having a high adhesiveness. Moreover, the wiring electrodes 11 and 12 are formed on the inner side of the ohmic electrode 19 forming ohmic junction.

Before the wiring electrodes 11 and 12 are formed, the gate electrode 4 is formed by forming the gate overlaying metal 4b on the metal film 10 in the gate-electrode formation region 21. Note that each gate electrode 4 may be a single layer of the metal film 10. In a case of the single layer, gate cross-sectional area that can withstand current capacity applied to one gate electrode 4 is needed, and thus the thickness of the metal film 10 needs to be increased.

The wiring electrode 12 is preferably a metal containing Au but may be a metal such as Cu, Ti, Al, Au, Ni, Nb, Pd, Pt, Cr, W, Ta, or Mo or a combination of a plurality of metals among them. However, when the wiring electrode 12 contains the material of the metal film 10 such as Pt, residues that are difficult to remove are generated at formation of the through-hole 9. Thus, the wiring electrode 12 preferably does not contain the material of the metal film 10.

Figure 23:
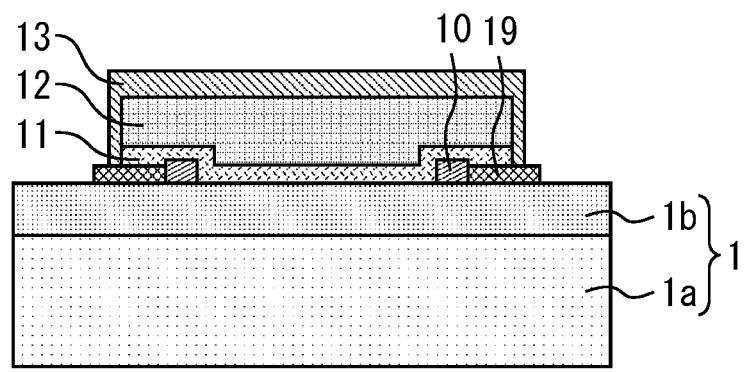
FIG. 23 is a cross-sectional view illustrating the method for manufacturing the semiconductor device according to Embodiment 2.
Figure 24:
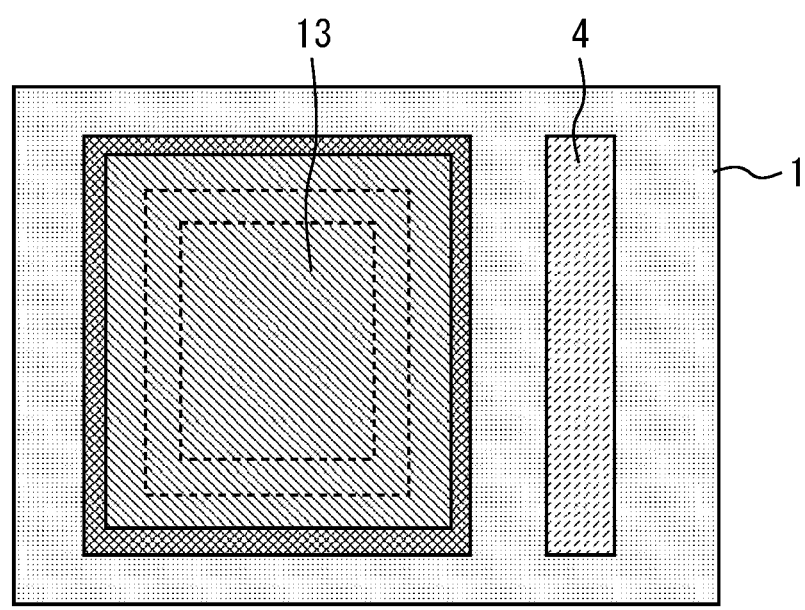
FIG. 24 is a plan view illustrating the method for manufacturing the semiconductor device according to Embodiment 2.

Subsequently, as illustrated in FIGS. 23 and 24, the front-surface power supply layer 13 is formed to entirely cover the wiring electrode 12. The front-surface power supply layer 13 is formed on the inner side of the ohmic electrode 19 and on the outer side of the wiring electrodes 11 and 12. The material of the front-surface power supply layer 13 is preferably an alloy containing Pt and is, for example, Ti/Pt/Au. Accordingly, Br corrosion can be prevented.

Figure 25:
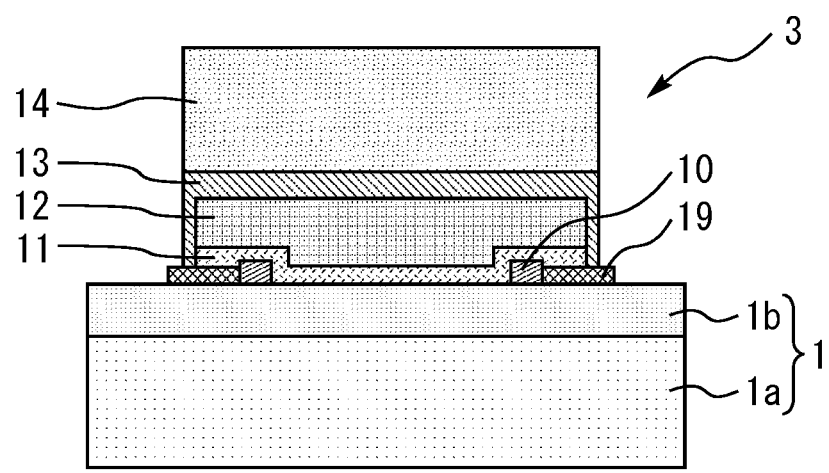
FIG. 25 is a cross-sectional view illustrating the method for manufacturing the semiconductor device according to Embodiment 2.
Figure 26:
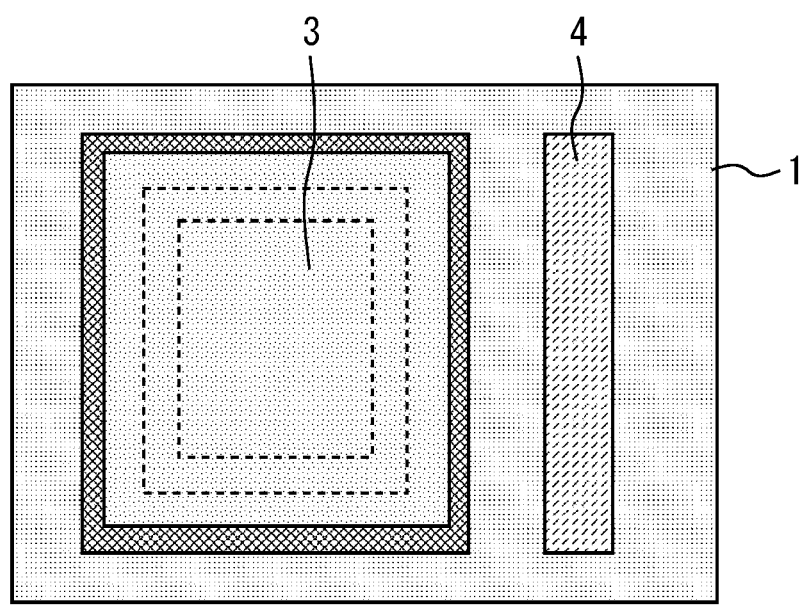
FIG. 26 is a plan view illustrating the method for manufacturing the semiconductor device according to Embodiment 2.

Subsequently, as illustrated in FIGS. 25 and 26, Au plating is performed to form the front-surface plating 14 on the front-surface power supply layer 13. The present process completes a wafer process on the front-surface side.

Figure 27:
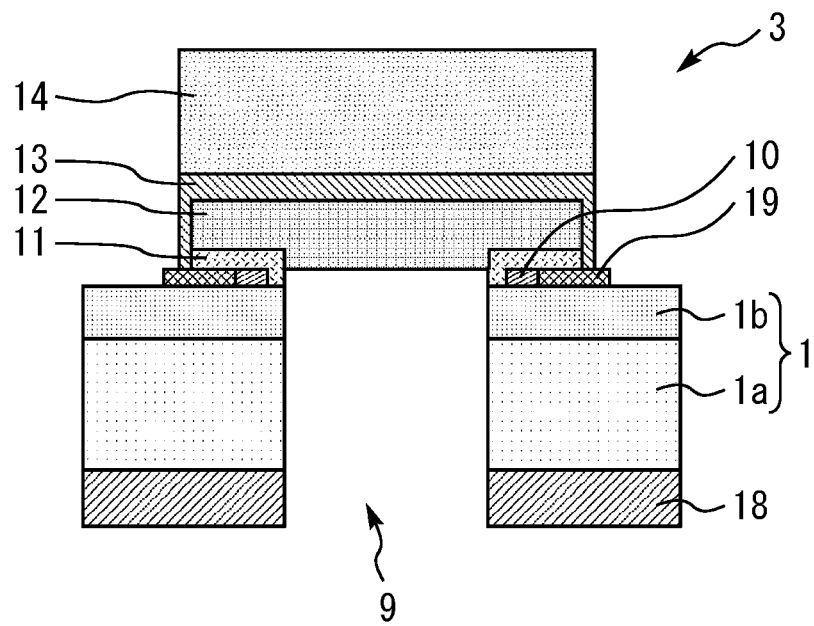
FIG. 27 is a cross-sectional view illustrating the method for manufacturing the semiconductor device according to Embodiment 2.

Subsequently, as illustrated in FIG. 27, similarly to Embodiment 1, the metal mask 18 is formed and the through-hole 9 is formed by selective dry etching or the like. The through-hole 9 is formed inside the ring-shaped metal film 10 in plan view. Wet etching is performed to remove sidewall residues generated on the sidewall of the through-hole 9 at the dry etching. Side etching can be prevented since the metal film 10 is provided, and accordingly, anomaly such as metal floating can be prevented and reliability can be improved.

Figure 28:
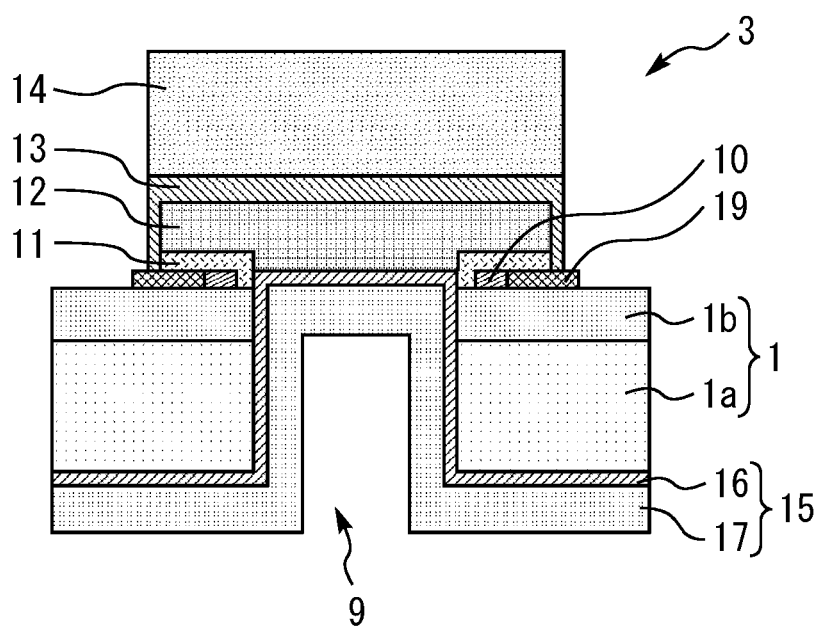
FIG. 28 is a cross-sectional view illustrating the method for manufacturing the semiconductor device according to Embodiment 2.

Lastly, as illustrated in FIG. 28, the metal mask 18 is removed and the back-surface power supply layer 16 and the back-surface plating 17 are formed on the back surface of the semiconductor substrate 1 and in the through-hole 9.

As described above, each source electrode 3 is an ISV source electrode and has the same configuration as the source pad 6 of Embodiment 1. Thus, the same effect as in Embodiment 1 can be obtained. However, the metal film 10 made of Pt or the like having a high work function is not preferable as an ohmic electrode in terms of characteristics. Thus, the ohmic electrode 19 is provided without the metal film 10 at an outer peripheral part of the lower surface of the source electrode 3. Accordingly, degradation of contact resistance can be prevented.

REFERENCE SIGNS LIST 1 semiconductor substrate; 3 source electrode (front-surface electrode); 4 gate electrode; 6 source pad (front-surface electrode); 9 through-hole; 10 metal film; 11,12 wiring electrode; 13 front-surface power supply layer; 14 front-surface plating; 15 back-surface electrode; 19 ohmic electrode

The invention claimed is:
1. A semiconductor device comprising:
a semiconductor substrate including a front surface and a back surface opposite to each other, and a through-hole penetrating from the back surface to the front surface;
a metal film surrounding the through-hole and formed in a ring shape on the front surface;
a front-surface electrode including a wiring electrode covering the through-hole and the metal film and joined to the front surface outside the metal film; and
a back-surface electrode formed on the back surface and inside the through-hole and connected to the wiring electrode,
wherein the metal film has a lower ionization tendency and a higher work function than the wiring electrode.
2. The semiconductor device according to claim 1, wherein the metal film is a single-layer metal made of any metal of Pt, Ni, and Ta or is a multiple-layer metal including the metal as its lowermost layer.
3. The semiconductor device according to claim 1, further comprising a gate electrode Schottky-joined to the front surface and including a film of the same material as that of the metal film.
4. The semiconductor device according to claim 1, wherein the wiring electrode does not contain Pt.
5. The semiconductor device according to claim 1, wherein the front-surface electrode includes a front-surface power supply layer formed on the wiring electrode and a front-surface plating formed on the front-surface power supply layer, and
the front-surface power supply layer contains Pt.

6. The semiconductor device according to claim 1, wherein the front-surface electrode is a source pad connected to a plurality of source electrodes of a transistor.

7. The semiconductor device according to claim 1, wherein the front-surface electrode is a source electrode of a transistor and includes an ohmic electrode ohmic-joined to the front surface.

8. A method for manufacturing a semiconductor device comprising:
   forming a metal film in a ring shape on a front surface of a semiconductor substrate;
   forming a front-surface electrode including a wiring electrode covering the metal film on the front surface and joining the front-surface electrode to the front surface outside the metal film;
   etching the semiconductor substrate from a back surface to form a through-hole, which reaches the wiring electrode inside the metal film in a ring shape, in the semiconductor substrate;
   after forming the through-hole, performing wet etching using strongly acid solution to remove a residue generated on a sidewall of the through-hole; and
   forming a back-surface electrode on the back surface and in the through-hole and connecting the back-surface electrode to the wiring electrode,
   wherein the metal film has a lower ionization tendency and a higher work function than the wiring electrode.

9. The method for manufacturing a semiconductor device according to claim 8, further comprising forming a gate electrode Schottky-joined to the front surface simultaneously with the metal film.

10. The method for manufacturing a semiconductor device according to claim 8, wherein the metal film is formed by sputtering.

\* \* \* \* \*